United States Patent [19]
Raad et al.

[11] Patent Number: 5,557,579
[45] Date of Patent: Sep. 17, 1996

[54] POWER-UP CIRCUIT RESPONSIVE TO SUPPLY VOLTAGE TRANSIENTS WITH SIGNAL DELAY

[75] Inventors: George B. Raad; Stephen L. Casper, both of Boise, Id.

[73] Assignee: Micron Technology, Inc., Boise, Id.

[21] Appl. No.: 494,718

[22] Filed: Jun. 26, 1995

[51] Int. Cl.$^6$ ........................................... G11C 5/00
[52] U.S. Cl. ..................... 365/226; 365/189.09; 365/194
[58] Field of Search ........................... 365/226, 189.09, 365/194

[56] References Cited

U.S. PATENT DOCUMENTS

| | | | |
|---|---|---|---|
| 5,400,294 | 3/1995 | Srinivasan et al. | 365/226 |
| 5,408,435 | 4/1995 | McClure et al. | 365/226 |
| 5,426,601 | 6/1995 | Agata et al. | 365/226 |
| 5,436,586 | 7/1995 | Miyamoto | 365/226 |
| 5,455,797 | 10/1995 | Etoh et al. | 365/189.09 |
| 5,493,234 | 2/1996 | Oh | 365/189.29 |

Primary Examiner—Joseph E. Clawson, Jr.
Attorney, Agent, or Firm—Seed and Berry LLP

[57] ABSTRACT

A power-up circuit in a computer system drives a memory device such as a dynamic random access memory (DRAM) to an initial condition after the computer system is turned on or reset. The power-up circuit also advantageously drives the memory device into the initial condition upon detecting a transient such as a negative glitch in a supply voltage being provided to the memory device. The power-up circuit includes a voltage level detector which causes a power-up signal to be provided to the memory device upon detecting that the supply voltage is less than a threshold voltage of the memory device which is necessary for the memory device to operate in an operational state. The power-up circuit also includes a delay circuit which causes the power-up signal to be provided to the memory device upon detecting that the supply voltage is beginning to rise from a quiescent voltage and at least until an amount of time determined by an RC time constant of the memory device for the memory device to enter the initial condition has passed. In response to receiving the power-up signal, the memory device enters the initial condition.

17 Claims, 3 Drawing Sheets

POWER-UP CIRCUIT RESPONSIVE TO SUPPLY VOLTAGE TRANSIENTS WITH SIGNAL DELAY

TECHNICAL FIELD

This invention is directed in general to power-up circuits, and, more particularly, to power-up circuits which drive an electronic device to an initial condition upon detecting a transient in a supply voltage being provided to the electronic device.

BACKGROUND OF THE INVENTION

After a computer system is turned on or reset, many electronic devices in the computer system need to be driven to an initial condition prior to being used. An example of such an electronic device is a memory device. A typical memory device has memory cells which use a variety of logic circuits such as latches, gates and flip-flops to support their operation. These logic circuits need to be driven to an initial condition before the memory device is used to store data. A typical memory device also has a variety of capacitively loaded nodes which need to be driven to an initial condition such as a particular voltage.

Many electronic devices need a certain amount of time to enter an initial condition before they are ready to be used. One such electronic device is a memory device referred to as a dynamic random access memory (DRAM). A typical DRAM has a variety of capacitively loaded nodes which need to be driven to an initial condition at a particular voltage. For example, a typical DRAM has a plurality of DRAM memory cells, each of which includes a capacitor and an NMOS transistor. Each capacitor in each DRAM memory cell has one plate of its own coupled to a source terminal of its respective NMOS transistor and another plate shared in common among the capacitors in all of the DRAM memory cells. This common capacitor plate is referred to as the cell plate, and it often needs to be driven to an initial condition at a particular voltage. Since the cell plate is capacitively loaded, it is a node which needs a certain amount of time to enter the initial condition at the particular voltage. Since the typical DRAM has a variety of capacitively loaded nodes, including the cell plate, it has an overall RC time constant which controls the amount of time it needs to enter the initial condition. In a typical DRAM, this amount of time is in the range of 50 µS.

Since many electronic devices need to be driven to an initial condition prior to their use, circuit designers have conventionally designed these electronic devices to respond to a signal referred to as a power-up signal by entering the initial condition. Also, since these electronic devices often need a certain amount of time to enter the initial condition, circuit designers have conventionally used a resistor-capacitor (RC) time delay circuit to provide the power-up signal. In a typical RC time delay circuit, a voltage on a capacitor in an RC network in the circuit begins rising as a function of an RC time constant of the RC network when the circuit detects a supply voltage rising from a quiescent voltage such as 0.0 volts. This rising supply voltage is indicative of a computer system which has just been turned on or reset. At the same time that the voltage on the capacitor is rising, the RC time delay circuit provides the power-up signal to an electronic device to drive the electronic device to an initial condition. When the voltage on the capacitor rises to a certain level, the RC time delay circuit trips and stops providing the power-up signal to the electronic device. Circuit designers set the RC time constant of the RC network such that the RC time delay circuit provides the power-up signal to the electronic device for at least the amount of time the electronic device needs to enter the initial condition.

Although the conventional RC time delay circuit is generally adequate for driving an electronic device into an initial condition prior to its use, the present invention recognizes that the circuit is problematic for other reasons. The conventional RC time delay circuit cannot adequately detect a transient, such as a negative glitch, in a supply voltage being provided to an electronic device because the RC time constant of the RC network of the circuit makes the circuit too slow to react to the transient. This is a problem because, in many of the electronic devices the RC time delay circuit is used with, a transient in the supply voltage can cause the electronic device to enter an unknown state. In the case of one typical DRAM, for example, a transient in the supply voltage which drops the supply voltage below a threshold voltage of about 1.5 volts can cause a variety of latches, gates and flip-flops used to support the operation of memory cells in the DRAM to unlatch and lose latch data they are storing. This problem is exacerbated by a modern trend toward reducing power consumption in electronic devices by using lower supply voltages such as 3.3 volts instead of higher supply voltages such as 5.0 volts. With a lower supply voltage, a transient in the supply voltage is more likely to cause an electronic device to enter an unknown state.

Therefore, there is a need in the art for a circuit which drives an electronic device to an initial condition prior to its use and which drives an electronic device to an initial condition upon detecting a transient in a supply voltage being provided to the electronic device.

SUMMARY OF THE INVENTION

The present invention provides systems and methods for driving an electronic device such as a memory device to an initial condition by providing a power-up signal to the electronic device. The electronic device has an RC time constant and is of the type to respond to the power-up signal by entering the initial condition after an amount of time determined by the RC time constant. The electronic device is also of the type to operate in an operational state when it receives a supply voltage greater than a threshold voltage and to be off when it receives a supply voltage equal to a quiescent voltage. A preferred embodiment of the present invention includes a power-up circuit having a voltage level detector providing a first reset signal in response to detecting that the supply voltage is less than the threshold voltage. The power-up circuit also has a delay circuit providing a second reset signal in response to detecting that the supply voltage is beginning to rise from the quiescent voltage and at least until the amount of time determined by the RC time constant of the electronic device for the electronic device to enter the initial condition has passed. The power-up circuit further has a logic circuit coupled to the voltage level detector and the delay circuit. The logic circuit provides the power-up signal to the electronic device in response to receiving at least one of the first and second reset signals.

The present invention thus advantageously drives an electronic device such as a memory device to an initial condition upon detecting a transient such as a negative glitch in a supply voltage being provided to the electronic device.

BRIEF DESCRIPTION OF THE DRAWINGS

These and other features of the present invention will become better understood with regard to the following description, appended claims, and accompanying drawings where:

DETAILED DESCRIPTION OF THE INVENTION

Figure 1:
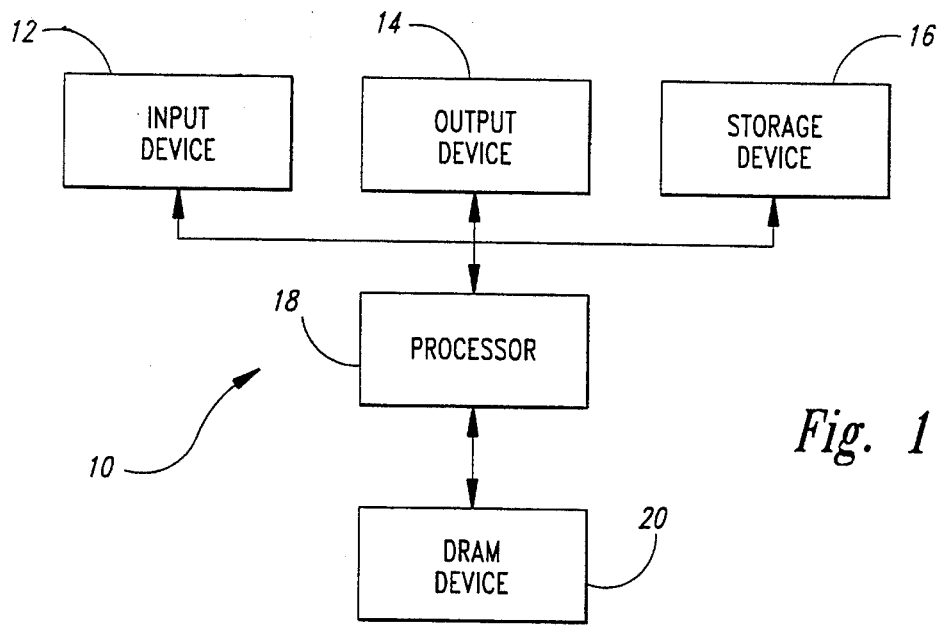
FIG. 1 is a block diagram of a preferred computer system according to the present invention.

In a preferred embodiment, shown in FIG. 1, a computer system 10 includes an input device 12 such as a keyboard, an output device 14 such as a CRT monitor, and a storage device 16 such as a disk drive, all coupled to a conventional processor 18. The computer system 10 further includes a memory device, such as a dynamic random access memory (DRAM) device 20, coupled to the processor 18. Although the present invention will be described with respect to this preferred embodiment which includes a DRAM device, it will be understood by those having skill in the field of this invention that the present invention includes within its scope any electronic device, including any memory device.

Figure 2:
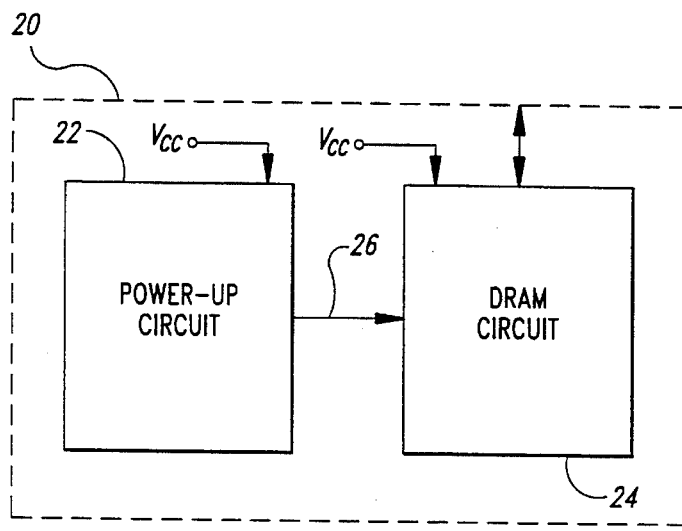
FIG. 2 is a block diagram showing the memory device of the preferred computer system of FIG. 1 in more detail.

The preferred DRAM device 20 of FIG. 1 is shown in more detail in FIG. 2. The DRAM device 20 includes a power-up circuit 22 coupled to a DRAM circuit 24 to provide a power-up signal 26 to the DRAM circuit 24. Both the power-up circuit 22 and the DRAM circuit 24 receive a supply voltage $V_{cc}$. The DRAM circuit 24 is a typical DRAM as discussed above which is constructed to respond to the power-up signal 26 by entering an initial condition after an amount of time determined by an RC time constant of the DRAM circuit 24. The DRAM circuit 24 is also constructed such that it requires the supply voltage $V_{cc}$ to be greater than a threshold voltage in order for it to operate in an operational state.

Figure 3:
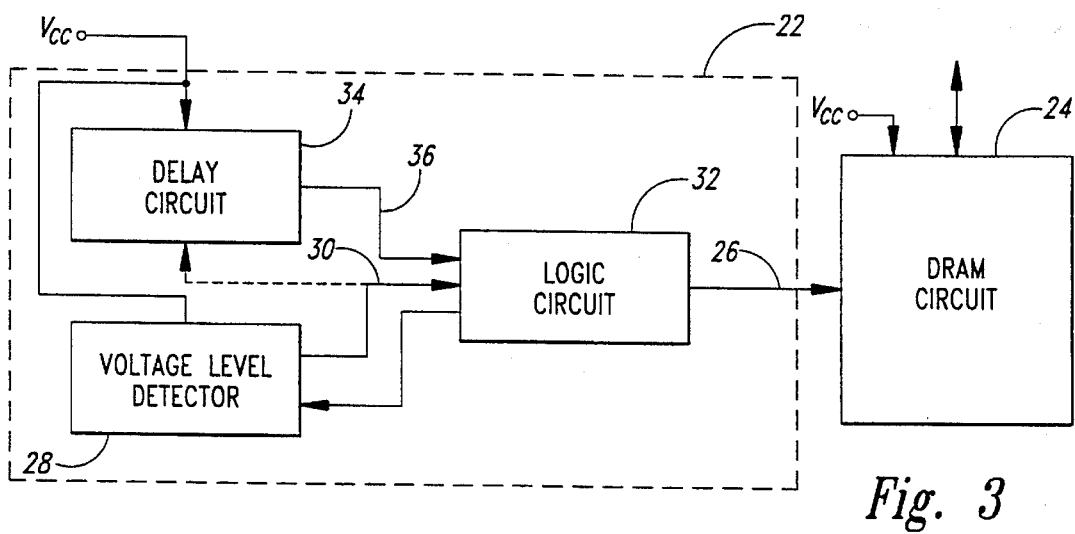
FIG. 3 is a block diagram showing the power-up circuit of the preferred computer system of FIGS. 1 and 2 in more detail.

The preferred power-up circuit 22 of FIG. 2 is shown in more detail in FIG. 3. The power-up circuit 22 includes a voltage level detector 28 which detects that the supply voltage $V_{cc}$ is less than the threshold voltage of the DRAM circuit 24 and provides a first reset signal 30 to a logic circuit 32 in response. This condition is referred to as a negative glitch in the supply voltage $V_{cc}$, and it would normally occur only after the DRAM circuit 24 has begun operating in its operational state and the supply voltage $V_{cc}$ has risen to an operational value such as 3.3 volts. The power-up circuit 22 also includes a delay circuit 34 which provides a second reset signal 36 to the logic circuit 32 in response to detecting that the supply voltage $V_{cc}$ is beginning to rise from a quiescent voltage such as 0.0 volts. The delay circuit 34 has a time constant that causes the second reset signal 36 to have a duration at least as long as the amount of time required for the DRAM circuit 24 to enter the initial condition. This situation would normally occur when the preferred computer system is turned on or reset. In response to receiving at least one of the first and second reset signals 30 and 36, the logic circuit 32 provides the power-up signal 26 to the DRAM circuit 24. The preferred power-up circuit 22 thus advantageously drives the DRAM circuit 24 to the initial condition prior to its use and upon detecting a negative glitch in the supply voltage $V_{cc}$.

In an alternative version of the preferred power-up circuit 22, the voltage level detector 28 provides the first reset signal 30 not only to the logic circuit 32 but also to the delay circuit 34 in response to detecting that the supply voltage $V_{cc}$ is less than the threshold voltage of the DRAM circuit 24. In response to receiving the first reset signal 30, the delay circuit 34 provides the second reset signal 36 to the logic circuit 32 for a duration at least long enough for the DRAM circuit 24 to enter the initial condition. In turn the logic circuit 32 provides the power-up signal 26 to the DRAM circuit 24 in response to receiving the second reset signal 36. In this manner the described alternative version of the preferred power-up circuit 22 ensures that the power-up signal 26 drives the DRAM circuit 24 to the initial condition after a negative glitch in the supply voltage $V_{cc}$ is detected.

Figure 4:
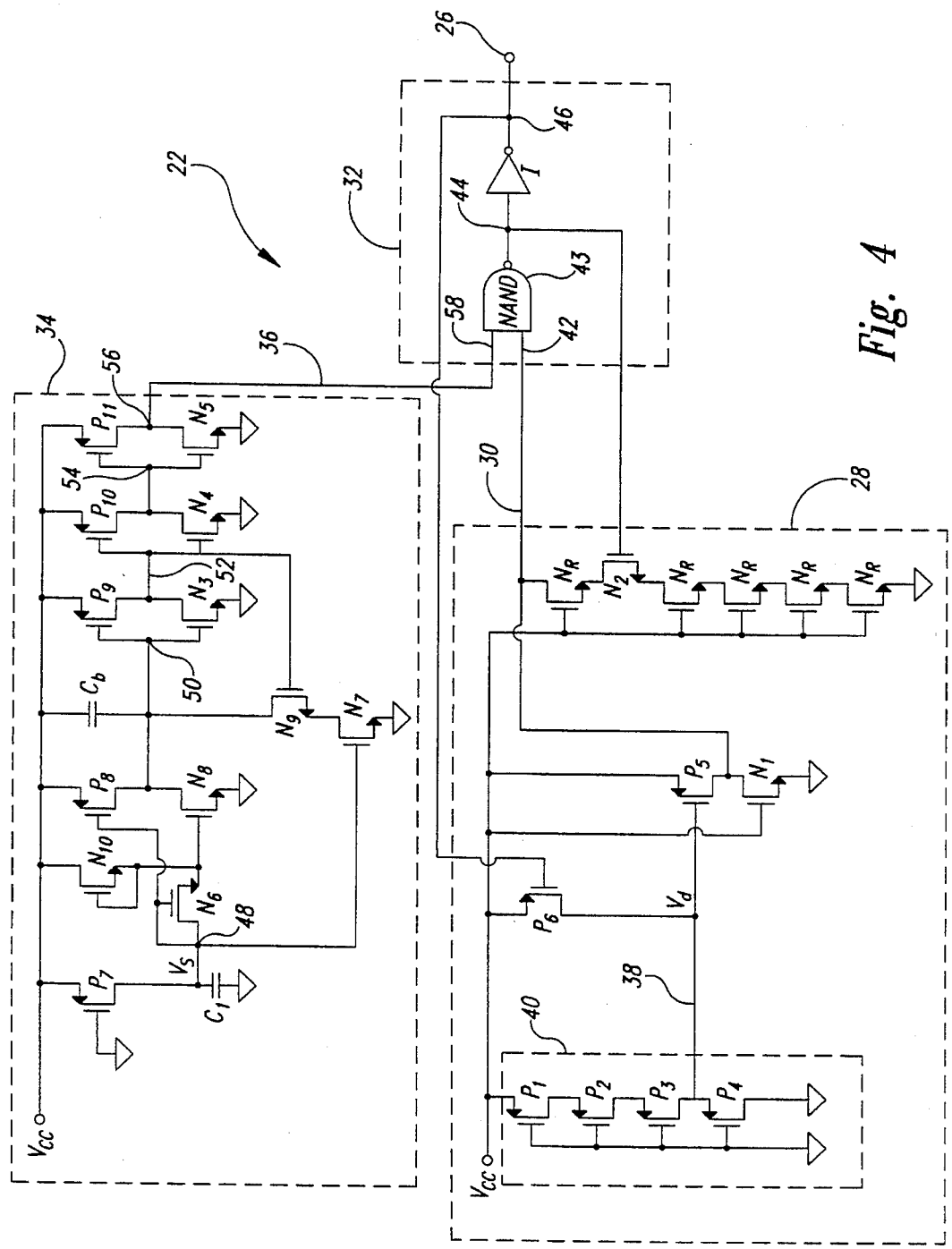
FIG. 4 is a schematic and logic diagram of the preferred power-up circuit of FIG. 4.

A schematic and logic diagram of the preferred power-up circuit 22 of FIGS. 2 and 3 is shown in FIG. 4. In operation, the supply voltage $V_{cc}$ is initially at a quiescent voltage such as 0.0 volts. When the preferred computer system is turned on or reset, the supply voltage $V_{cc}$ begins to rise from the quiescent voltage. At the same time, a divider voltage $V_d$ equal to a fraction of the supply voltage $V_{cc}$ also begins to rise at a tap terminal 38 of a voltage divider 40 of the voltage level detector 28. The voltage divider 40 includes three PMOS transistors $P_1$, $P_2$ and $P_3$ configured as resistive devices between the tap terminal 38 and the supply voltage $V_{cc}$ and another PMOS transistor $P_4$ configured as a resistive device between the tap terminal 38 and ground.

When the supply voltage $V_{cc}$ rises above a threshold voltage of an NMOS transistor $N_1$ of the voltage level detector 28, the transistor $N_1$ turns on and pulls its drain close to ground, thereby providing the first reset signal 30. At the same time, a PMOS transistor $P_5$ of the voltage level detector 28 is off because the drop from the supply voltage $V_{cc}$ to the divider voltage $V_d$ is less than a threshold voltage of the transistor $P_5$. When the first reset signal 30 is provided to a first input terminal 42 of a NAND gate 43 of the logic circuit 32, it causes the NAND gate 43 to provide a high voltage at a NAND gate output terminal 44. Because the NAND gate output terminal 44 is a logic high signal, an NMOS transistor $N_2$ of the voltage level detector 28 turns on and couples the first input terminal 42 of the NAND gate 43 to ground through a series of NMOS transistors $N_R$ of the voltage level detector 28. The transistor $N_2$ thereby provides hysteresis to assist the transistor $N_1$ in pulling the first input terminal 42 of the NAND gate 43 to ground and hence in providing the first reset signal 30. The NAND gate output terminal 44 provides its logic high signal to an inverter I of the logic circuit 32 which in turn provides a logic low power-up signal at an output terminal 46 as the power-up signal 26. Because the output terminal 46 of the inverter I has a logic low level, it turns a PMOS transistor $P_6$ of the voltage level detector 28 on and couples the tap terminal 38 to the supply voltage $V_{cc}$. The transistor $P_6$ thereby provides additional hysteresis in pulling the tap terminal 38 to a logic high level.

As the supply voltage $V_{cc}$ continues to rise, the divider voltage $V_d$ also continues to rise. When the drop from the supply voltage $V_{cc}$ to the divider voltage $V_d$ is greater than the threshold voltage of the transistor $P_5$, the transistor $P_5$ turns on. At this time, the drain of the transistor $P_5$ rises almost to the supply voltage $V_{cc}$ and terminates the first reset signal 30. This occurs despite the transistor $N_1$ being on because the transistor $P_5$ is constructed to have a much smaller resistance than the transistor $N_1$. Because the drain of the transistor $P_5$ rises almost to the supply voltage $V_{cc}$, the input terminal 42 of the NAND gate 43 also rises almost to the supply voltage $V_{cc}$.

As mentioned above, the delay circuit 34 also generates a reset signal when the supply voltage $V_{cc}$ increases from a quiescent voltage. With reference to the upper portion of FIG. 4, when the supply voltage $V_{cc}$ first begins to rise from the quiescent voltage, a switching voltage $V_s$ at an output terminal 48 of an RC circuit of the delay circuit 34 also begins to rise. The RC circuit comprises a PMOS transistor $P_7$ configured as a resistive device and a capacitor $C_1$. Because the output terminal 48 of the RC circuit is capacitively loaded by the capacitor $C_1$, the switching voltage $V_s$ will not rise as quickly as the supply voltage $V_{cc}$. As a result, as the supply voltage $V_{cc}$ rises, the drop from the supply voltage $V_{cc}$ to the switching voltage $V_s$ exceeds a threshold voltage of a PMOS transistor $P_8$ of the delay circuit 34. When this occurs, the transistor $P_8$ turns on and pulls an input terminal 50 of a first buffer device of the delay circuit 34 comprising PMOS and NMOS transistors $P_9$ and $N_3$, respectively, up to the supply voltage $V_{cc}$. A capacitor $C_b$ of the delay circuit 34 assists the transistor $P_8$ in pulling the input terminal 50 of the first buffer device up to the supply voltage $V_{cc}$. Because the input terminal 50 of the first buffer device is at the supply voltage $V_{cc}$, the transistor $N_3$ turns on and pulls an input terminal 52 of a second buffer device of the delay circuit 34 comprising PMOS and NMOS transistors $P_{10}$ and $N_4$ down to ground. Because the input terminal 52 of the second buffer device is at ground, the transistor $P_{10}$ turns on and pulls an input terminal 54 of a third buffer device of the delay circuit 34 comprising PMOS and NMOS transistors $P_{11}$ and $N_5$ up to the supply voltage $V_{cc}$. Because the input terminal 54 of the third buffer device is at the supply voltage $V_{cc}$, the transistor $N_5$ turns on and pulls an output terminal 56 of the third buffer device down to ground, thereby providing the second reset signal 36 to a second input terminal 58 of the NAND gate.

As the supply voltage $V_{cc}$ continues to rise, the switching voltage $V_s$ rises sufficiently to turn on a diode-configured NMOS transistor $N_6$ and an NMOS transistor $N_7$ of the delay circuit 34. When the drop from the supply voltage $V_{cc}$ to the switching voltage $V_s$ falls below the threshold voltage of the transistor $P_8$, an NMOS transistor $N_8$ of the delay circuit 34 turns on and the transistor $P_8$ turns off. When this occurs, the input terminal 50 of the first buffer device is pulled to ground by the transistor $N_8$, the input terminal 52 of the second buffer device is pulled up to the supply voltage $V_{cc}$ by the transistor $P_9$, the input terminal 54 of the third buffer device is pulled to ground by the transistor $N_4$, and the output terminal 56 of the third buffer device is pulled up to the supply voltage $V_{cc}$ by the transistor $P_{11}$, thereby terminating the second reset signal 36. Because the input terminal 52 of the second buffer device is pulled up to the supply voltage $V_{cc}$, an NMOS transistor $N_9$ of the delay circuit 34 turns on and assists the transistor $N_8$ in pulling the input terminal 50 of the first buffer device down to ground, thereby providing hysteresis. Also, because the time at which the switching voltage $V_s$ turns the transistor $P_8$ off and the transistor N8 on is a function of the resistance of the transistor $P_7$ and the capacitance of the capacitor $C_1$, these values are set such that the second reset signal 36 is terminated after an amount of time at least equal to the amount of time required for the DRAM circuit (FIG. 3) to enter a an initial condition.

When the first and second reset signals 30 and 36 are terminated and the first and second input terminals 42 and 58 of the NAND gate are at the supply voltage $V_{cc}$, the NAND gate 43 provides a low voltage at its output terminal 44 to the inverter I, which in turn provides a high voltage at its output terminal 46, thereby terminating the power-up signal 26. At the same time, the low voltage at the NAND gate output terminal 44 and the high voltage at the inverter I output terminal 46 turn off the transistors $N_2$ and $P_6$, respectively, and thereby provide hysteresis.

During subsequent operation, if a transient such as a negative glitch occurs on the supply voltage $V_{cc}$ which is sufficient to make the drop from the supply voltage $V_{cc}$ to the divider voltage $V_d$ less than the threshold voltage of the transistor $P_5$, then the transistor $P_5$ turns off and the transistor $N_1$ again pulls the first input terminal 42 of the NAND gate down to ground and thereby provides the first reset signal 30. Operation of the preferred power-up circuit 22 when the first reset signal 30 is provided is described above. The preferred power-up circuit 22 thus advantageously provides the power-up signal 26 upon detecting a negative glitch in the supply voltage $V_{cc}$. Also, when the preferred computer system is subsequently turned off and the supply voltage $V_{cc}$ drops to the quiescent voltage, a diode-connected NMOS transistor $N_{10}$ of the delay circuit 34 turns on, causing the capacitor $C_1$ to discharge back to the supply voltage $V_{cc}$ through the transistors $N_6$ and $N_{10}$.

Figure 5:
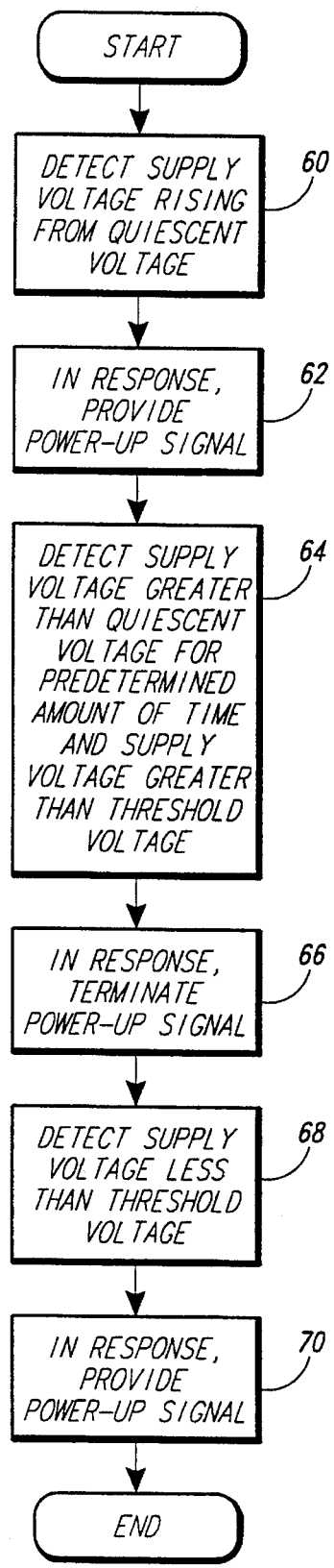
FIG. 5 is a flow diagram showing a method for driving an electronic device into an initial condition according to the present invention.

In another embodiment, the present invention provides a method in a computer system for driving an electronic device into an initial condition as shown in FIG. 5. In an initial step 60, the method includes detecting that a supply voltage is beginning to rise from a quiescent voltage. In another step 62, the method includes initiating providing a power-up signal to the electronic device in response to detecting that the supply voltage is beginning to rise from the quiescent voltage. In a further step 64, the method includes detecting that the supply voltage has been greater than the quiescent voltage for a predetermined amount of time and that the supply voltage is greater than a threshold voltage. In a still further step 66, the method includes terminating providing the power-up signal to the electronic device in response to detecting that the supply voltage has been greater than the quiescent voltage for the predetermined amount of time and in response to detecting that the supply voltage is greater than the threshold voltage. In this manner the electronic device begins to operate in an operational state. In another step 68, the method includes detecting that the supply voltage is less than the threshold voltage after a period of time in which the electronic device operates in the operational state. As a result, the electronic device discontinues operating in the operational state. In still another step 70, the method includes providing the power-up signal to the electronic device in response to detecting that the supply voltage is less than the threshold voltage.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

We claim:

1. A power-up circuit for driving an electronic device to an initial condition by providing a power-up signal to the electronic device, the electronic device being of the type to respond to the power-up signal by entering the initial condition after a time delay, the electronic device also being of the type to operate in an operational state when receiving a supply voltage greater than a threshold voltage, the electronic device further being of the type to be off when receiving a supply voltage equal to a quiescent voltage, the power-up circuit comprising:

a voltage level detector providing a first reset signal in response to detecting that the supply voltage is less than the threshold voltage;

a delay circuit providing a second reset signal in response to detecting that the supply voltage is beginning to rise from the quiescent voltage and at least until the time delay of the electronic device has passed; and a logic circuit coupled to the voltage level detector and the delay circuit, the logic circuit providing the power-up signal to the electronic device in response to receiving at least one of the first and second reset signals, whereby the electronic device enters the initial condition after its time delay when the supply voltage begins to rise from the quiescent voltage and the electronic device also enters the initial condition when the supply voltage is less than the threshold voltage.

2. The power-up circuit of claim 1 wherein the delay circuit is coupled to the voltage level detector and receives the first reset signal, wherein the delay circuit also provides the second reset signal in response to receiving the first reset signal and at least until the time delay of the electronic device has passed.

3. The power-up circuit of claim 1 wherein the voltage level detector comprises:

a voltage divider receiving the supply voltage and providing a divider voltage which is a fraction of the supply voltage; and a first switching device having a control terminal coupled to the voltage divider and receiving the divider voltage, the first switching device being configured to provide the first reset signal when the received divider voltage is such that the supply voltage is less than the threshold voltage.

4. The power-up circuit of claim 3 wherein the voltage divider comprises:

a tap terminal providing the divider voltage;

an upper set of one or more switching devices coupled to one another in series between the supply voltage and the tap terminal and configured as resistive devices; and a lower set of one or more switching devices coupled to one another in series between the tap terminal and ground and configured as resistive devices.

5. The power-up circuit of claim 1 wherein the delay circuit comprises:

one or more buffer devices each having an input terminal and an output terminal, the one or more buffer devices being coupled to one another in series from first to last in the manner of output terminal to input terminal, the input terminal of the first of the one or more buffer devices receiving a switching voltage, the output terminal of the last of the one or more buffer devices providing the second reset signal; and an RC circuit having an output terminal coupled to the input terminal of the first of the one or more buffer devices and providing the switching voltage to the first of the one or more buffer devices, the RC circuit including a capacitive device and a switching device configured as a resistive device coupled to one another at the output terminal of the RC circuit in series between the supply voltage and ground, the RC circuit having an RC time constant which is such that the RC circuit provides the switching voltage to the first of the one or more buffer devices in a manner which allows the last of the one or more buffer devices to provide the second reset signal in response to the supply voltage beginning to rise from the quiescent voltage and at least until the time delay of the electronic device has passed.

6. The power-up circuit of claim 1 wherein the logic circuit comprises an AND gate having first and second input terminals coupled to the voltage level detector and the delay circuit, respectively, and further having an output terminal providing the power-up signal to the electronic device.

7. The power-up circuit of claim 1 wherein the logic circuit comprises:

a NAND gate having an output terminal and having first and second input terminals coupled to the voltage level detector and the delay circuit, respectively; and an inverter having an input terminal coupled to the NAND gate output terminal and having an output terminal providing the power-up signal to the electronic device.

8. The power-up circuit of claim 1 wherein the electronic device is a memory device.

9. A computer system comprising:

an input device;

an output device;

a storage device;

a processor coupled to the input, output and storage devices;

a memory device coupled to the processor, the memory device having an RC time constant and being constructed to respond to a power-up signal by entering an initial condition after an amount of time determined by the RC time constant, the memory device also being constructed to operate in an operational state when receiving a supply voltage greater than a threshold voltage, the memory device further being constructed to be off when receiving a supply voltage equal to a quiescent voltage; and a power-up circuit for driving the memory device to the initial condition by providing the power-up signal to the memory device, the power-up circuit comprising:

a voltage level detector providing a first reset signal in response to detecting that the supply voltage is less than the threshold voltage;

a delay circuit providing a second reset signal in response to detecting that the supply voltage is beginning to rise from the quiescent voltage and at least until the amount of time determined by the RC time constant of the memory device for the memory device to enter the initial condition has passed; and a logic circuit coupled to the voltage level detector and the delay circuit, the logic circuit providing the power-up signal to the memory device in response to receiving at least one of the first and second reset signals.

10. The computer system of claim 9 wherein the delay circuit is coupled to the voltage level detector and receives the first reset signal, wherein the delay circuit also provides the second reset signal in response to receiving the first reset signal and at least until the amount of time determined by the RC time constant of the memory device for the memory device to enter the initial condition has passed.

11. The computer system of claim 9 wherein the voltage level detector comprises:

a voltage divider receiving the supply voltage and providing a divider voltage which is a fraction of the supply voltage; and a first switching device having a control terminal coupled to the voltage divider and receiving the divider voltage, the first switching device being configured to provide the first reset signal when the received divider voltage is such that the supply voltage is less than the threshold voltage.

12. The computer system of claim 11 wherein the voltage divider comprises:
   a tap terminal for providing the divider voltage;
   an upper set of one or more switching devices coupled to one another in series between the supply voltage and the tap terminal and configured as resistive devices; and
   a lower set of one or more switching devices coupled to one another in series between the tap terminal and ground and configured as resistive devices.

13. The computer system of claim 9 wherein the delay circuit comprises:
   one or more buffer devices each having an input terminal and an output terminal, the one or more buffer devices being coupled to one another in series from first to last in the manner of output terminal to input terminal, the input terminal of the first of the one or more buffer devices receiving a switching voltage, the output terminal of the last of the one or more buffer devices providing the second reset signal; and
   an RC circuit having an output terminal coupled to the input terminal of the first of the one or more buffer devices and providing the switching voltage to the first of the one or more buffer devices, the RC circuit including a capacitive device and a switching device configured as a resistive device coupled to one another at the output terminal of the RC circuit in series between the supply voltage and ground, the RC circuit having an RC time constant which is such that the RC circuit provides the switching voltage to the first of the one or more buffer devices in a manner which allows the last of the one or more buffer devices to provide the second reset signal in response to the supply voltage beginning to rise from the quiescent voltage and at least until the amount of time determined by the RC time constant of the memory device for the memory device to enter the initial condition has passed.

14. The computer system of claim 9 wherein the logic circuit comprises an AND gate having first and second input terminals coupled to the voltage level detector and the delay circuit, respectively, and further having an output terminal providing the power-up signal to the memory device.

15. The computer system of claim 9 wherein the logic circuit comprises:
   a NAND gate having an output terminal and having first and second input terminals coupled to the voltage level detector and the delay circuit, respectively; and
   an inverter having an input terminal coupled to the NAND gate output terminal and having an output terminal providing the power-up signal to the memory device.

16. A dynamic random-access memory chip comprising:
   a dynamic random-access memory circuit, the dynamic random-access memory circuit having a first RC time constant and being constructed to respond to a power-up signal by entering an initial condition after an amount of time determined by the first RC time constant, the dynamic random-access memory circuit also being constructed to operate in an operational state when receiving a supply voltage greater than a threshold voltage, the dynamic random-access memory circuit further being constructed to be off when receiving a supply voltage equal to a quiescent voltage;
   a first capacitor having a first terminal providing a switching voltage and also having a second terminal coupled to ground;
   a first set of one or more PMOS transistors configured as resistive devices and coupled to one another in series between the supply voltage and the first terminal of the first capacitor, the switching voltage provided by the first terminal of the first capacitor having a rate of increase which is a function of a second RC time constant of the first set of PMOS transistors and the first capacitor;
   a first diode-connected NMOS transistor having gate and drain terminals coupled to the first terminal of the first capacitor and having a source terminal;
   a second diode-connected NMOS transistor having gate and source terminals coupled to the source terminal of the first diode-connected NMOS transistor and having a drain terminal receiving the supply voltage;
   an initial delay PMOS transistor having body and source terminals receiving the supply voltage, a gate terminal coupled to the first terminal of the first capacitor, and a drain terminal;
   an initial delay NMOS transistor having a drain terminal coupled to the drain terminal of the initial delay PMOS transistor, a gate terminal coupled to the source terminal of the first diode-connected NMOS transistor, and a source terminal coupled to ground;
   an odd number of pairs of delay PMOS transistors and delay NMOS transistors, each transistor in each pair having a gate terminal coupled to a gate terminal of the other transistor in the pair, each transistor in each pair having a drain terminal coupled to a drain terminal of the other transistor in the pair, the pairs being coupled to one another in series from first to last in the manner of drain terminal to gate terminal, each delay PMOS transistor in each pair having body and source terminals receiving the supply voltage, each delay NMOS transistor in each pair having a source terminal coupled to ground, the gate terminals of the transistors in the first of the odd number of pairs being coupled to the drain terminal of the initial delay NMOS transistor, the delay NMOS transistor in the last of the odd number of pairs being configured such that it turns on and pulls its drain terminal down to ground in response to the supply voltage beginning to rise from the quiescent voltage and for an amount of time which is a function of the second RC time constant and at least until the amount of time determined by the first RC time constant for the dynamic random access memory circuit to enter the initial condition has passed;
   a NAND gate having first and second input terminals and an output terminal, the first input terminal being coupled to the drain terminals of the transistors in the last of the odd number of pairs of delay PMOS transistors and delay NMOS transistors;
   a level-detect PMOS transistor having body and source terminals receiving the supply voltage, a drain terminal coupled to the second input terminal of the NAND gate, and a gate terminal;
   a second set of one or more PMOS transistors configured as resistive devices and coupled to one another in series between the supply voltage and the gate terminal of the level-detect PMOS transistor;
   a third set of one or more PMOS transistors configured as resistive devices and coupled to one another in series between the gate terminal of the level-detect PMOS transistor and ground;
   a level-detect NMOS transistor having a drain terminal coupled to the second input terminal of the NAND gate, a gate terminal receiving the supply voltage, and a source terminal coupled to ground, the level-detect NMOS transistor being configured such that it turns on and pulls the second input terminal of the NAND gate down to ground when the supply voltage is less than the threshold voltage; and an inverter having an input terminal coupled to the output terminal of the NAND gate and having an output terminal coupled to the dynamic random-access memory circuit and providing the power-up signal to the dynamic random-access memory circuit, the power-up signal being provided when at least one of the first and second input terminals of the NAND gate is pulled down to ground.

17. A method in a computer system for driving an electronic device to an initial condition, the electronic device being of the type to respond to a power-up signal by entering the initial condition, the electronic device also being of the type to operate in an operational state when receiving a supply voltage greater than a threshold voltage, the electronic device further being of the type to be off when receiving a supply voltage equal to a quiescent voltage, the method comprising:

detecting that the supply voltage is beginning to rise from the quiescent voltage;

in response to detecting that the supply voltage is beginning to rise from the quiescent voltage, initiating providing the power-up signal to the electronic device;

detecting that the supply voltage has been greater than the quiescent voltage for a predetermined amount of time and that the supply voltage is greater than the threshold voltage;

in response to detecting that the supply voltage has been greater than the quiescent voltage for the predetermined amount of time and that the supply voltage is greater than the threshold voltage, terminating providing the power-up signal to the electronic device, the electronic device thereby beginning to operate in the operational state;

after a period of time in which the electronic device operates in the operational state, detecting that the supply voltage is less than the threshold voltage, the electronic device thereby discontinuing operating in the operational state; and in response to detecting that the supply voltage is less than the threshold voltage, providing the power-up signal to the electronic device.

* * * * *